(12) United States Patent
Chen et al.

(10) Patent No.: US 12,219,731 B2
(45) Date of Patent: Feb. 4, 2025

(54) CENTRIFUGAL HEAT DISSIPATION FAN OF PORTABLE ELECTRONIC DEVICE

(71) Applicant: Acer Incorporated, New Taipei (TW)

(72) Inventors: Tsung-Ting Chen, New Taipei (TW); Wen-Neng Liao, New Taipei (TW); Cheng-Wen Hsieh, New Taipei (TW); Kuang-Hua Lin, New Taipei (TW); Wei-Chin Chen, New Taipei (TW); Yu-Ming Lin, New Taipei (TW)

(73) Assignee: Acer Incorporated, New Taipei (TW)

( * ) Notice: Subject to any disclaimer, the term of this patent is extended or adjusted under 35 U.S.C. 154(b) by 0 days.

(21) Appl. No.: 18/486,178

(22) Filed: Oct. 13, 2023

(65) Prior Publication Data

US 2024/0138098 A1 Apr. 25, 2024
US 2024/0237268 A9 Jul. 11, 2024

(30) Foreign Application Priority Data

Oct. 19, 2022 (TW) .................................. 111139595

(51) Int. Cl.
*H05K 7/20* (2006.01)
*F04D 17/16* (2006.01)
*F04D 29/28* (2006.01)

(52) U.S. Cl.
CPC ......... *H05K 7/20136* (2013.01); *F04D 17/16* (2013.01); *F04D 29/281* (2013.01)

(58) Field of Classification Search
CPC .. F04D 25/0613; F04D 29/281; F04D 29/282; F04D 29/30
See application file for complete search history.

(56) References Cited

U.S. PATENT DOCUMENTS

| | | | |
|---|---|---|---|
| 10,687,440 B1 * | 6/2020 | He | F04D 29/601 |
| 2005/0111985 A1 * | 5/2005 | Chen | F04D 29/263 |
| | | | 416/204 R |
| 2019/0128278 A1 * | 5/2019 | Chan | F04D 29/663 |

FOREIGN PATENT DOCUMENTS

| | | |
|---|---|---|
| CN | 109707647 | 9/2021 |
| CN | 215595988 | 1/2022 |
| JP | 5013012 | 8/2012 |
| TW | M254887 | 1/2005 |
| TW | M431957 | 6/2012 |
| TW | 201634819 | 10/2016 |

* cited by examiner

*Primary Examiner* — Brian O Peters
(74) *Attorney, Agent, or Firm* — JCIPRNET

(57) ABSTRACT

A centrifugal heat dissipation fan of a portable electronic device. The centrifugal heat dissipation fan includes a hub, multiple metal blades, and at least one ring. The metal blades are disposed surrounding the hub. The metal blades include multiple radial dimensions, and the structure of the metal blade with a shorter radial dimension is a part of the structure of the metal blade with a longer radial dimension. The metal blades having different radial dimensions form at least two ring areas, and the distribution numbers of the metal blades in the at least two ring areas are different from each other. The ring surrounds the hub and connects the metal blades.

14 Claims, 10 Drawing Sheets

CENTRIFUGAL HEAT DISSIPATION FAN OF PORTABLE ELECTRONIC DEVICE

CROSS-REFERENCE TO RELATED APPLICATION

This application claims the priority benefit of Taiwan application serial no. 111139595, filed on Oct. 19, 2022. The entirety of the above-mentioned patent application is hereby incorporated by reference herein and made a part of this specification.

BACKGROUND

Technical Field

The disclosure relates to a centrifugal heat dissipation fan, and more particularly, to a centrifugal dissipation fan of a portable electronic device.

Description of Related Art

As the design trend of electronic devices (such as notebook computers or tablet computers) is gradually becoming thinner and lighter, under the circumstance that the internal space is extremely limited, the heat dissipation fan installed therein is also required to be thinner as the goal. Therefore, in the case of limited space, the airflow of the heat dissipation fan cannot smoothly enter and exit the heat dissipation fan, which affects the heat dissipation efficiency of the heat dissipation fan.

Taking a centrifugal heat dissipation fan as an example, the flow channel of the centrifugal dissipation fan needs to be a volute-like progressive expansion design to allow the working fluid to generate a sufficient pressure difference change when entering and leaving the fan, so that the working fluid can enter the fan from the axial direction through the pressure difference change and be exhausted from the fan from the radial direction. However, such a way is easy to generate noise at the progressive expansion part of the flow channel due to the high-speed turning of the working fluid (from the axial direction to the radial direction). In particular, the existing blades are mostly configured equidistantly while the hub needs to be enlarged in order to increase the number of blades, thereby generating periodic noise and failing to facilitate the air intake volume of the fan.

Therefore, how to change the related structure of the existing centrifugal heat dissipation fan so as to facilitate the reduction in the noise problem is actually a subject to be considered by the relevant technicians.

SUMMARY

The disclosure provides a centrifugal heat dissipation fan of a portable electronic device, which reduces noise generated by the different matching of the distribution numbers of wheel blades and wave blades.

In the centrifugal heat dissipation fan of the portable electronic device of the disclosure, the centrifugal heat dissipation fan includes a hub, multiple metal blades, and at least one ring. The metal blades are disposed surrounding the hub. The metal blades include multiple radial dimensions, and the structure of the metal blade with a shorter radial dimension is a part of the structure of the metal blade with a longer radial dimension. The metal blades having different radial dimensions form at least two ring areas, and the distribution numbers of the metal blades in the at least two ring areas are different from each other. The ring surrounds the hub and connects the metal blades.

Based on the above, the centrifugal heat dissipation fan of the portable electronic device forms ring areas of different radial dimensions by arranging and configuring metal blades of multiple radial dimensions around the hub, and the distribution numbers of the metal blades in these ring areas are different from each other. In this way, the metal blades form a state in which the wheel blades and the wave blades are matched with each other, that is, the ring is served as the combination structure of the metal blades, so as to solve the situation that the number of metal blades increases and cannot be combined with the hub, thereby providing increased fan performance (air volume) and the structural strength of load operation. Furthermore, the metal blades have different distribution numbers along the radial areas, which may further disperse the situation of noise concentration caused by a single frequency.

DESCRIPTION OF THE EMBODIMENTS

Figure 1:
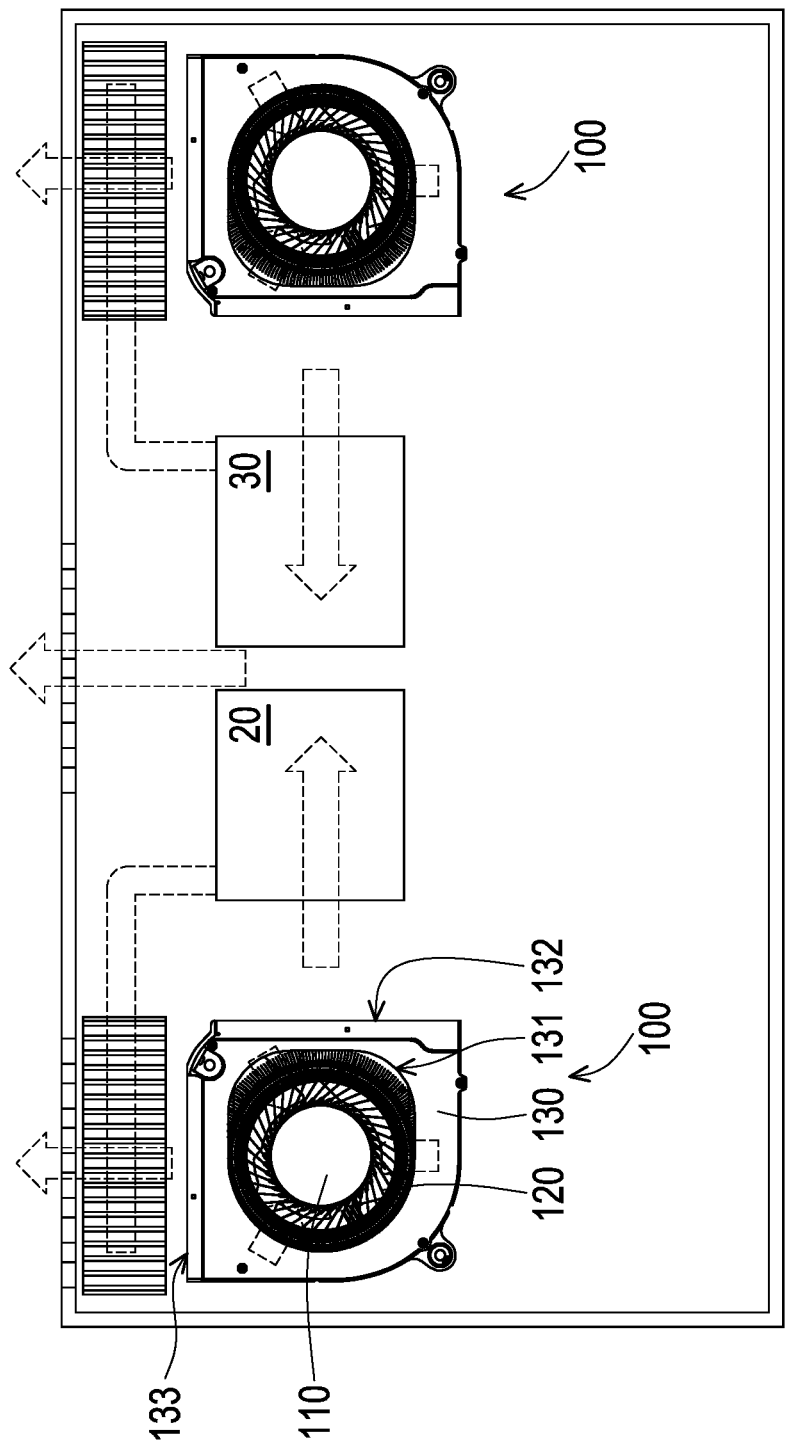
FIG. 1 is a simple schematic diagram of a portable electronic device according to an embodiment of the disclosure.

FIG. 1 is a simple schematic diagram of a portable electronic device according to an embodiment of the disclosure. FIG. 1 shows, from a top view perspective, that two centrifugal heat dissipation fans (hereinafter referred to as fans 100) are disposed in an interior space of a portable electronic device 10 to dissipate heat of heat sources 20 and 30, and the heat generated by the heat source 20 and the heat source 30 is transferred to fins through heat pipes (shown by dotted lines). Each of the fans 100 includes a hub 110, multiple metal blades 120, and a shell 130. The shell 130 has an air inlet 131 located in an axial direction and two air outlets 132 and 133 located in a radial direction. The air outlets 132 face directions of the heat source 20 and the heat source 30, the air outlets 133 face the fins and the outside of the portable electronic device 10, and in the case where the two fans 100 are configured corresponding to each other, airflow shown by dotted arrows shown in FIG. 1 is generated to dissipate heat from the portable electronic device 10 through multiple paths.

Here, the portable electronic device 10 is a notebook computer as an example, or a similar portable electronic device such as a tablet computer. As mentioned above, the existing fan technology is limited in the use environment and provides limited heat dissipation performance for the portable electronic device 100. Other fan technologies used in large equipment, such as turbines used in buildings or large machinery, have structures and conditions that are not required and cannot be used smoothly by the portable electronic device of the disclosure.

Figure 2A:
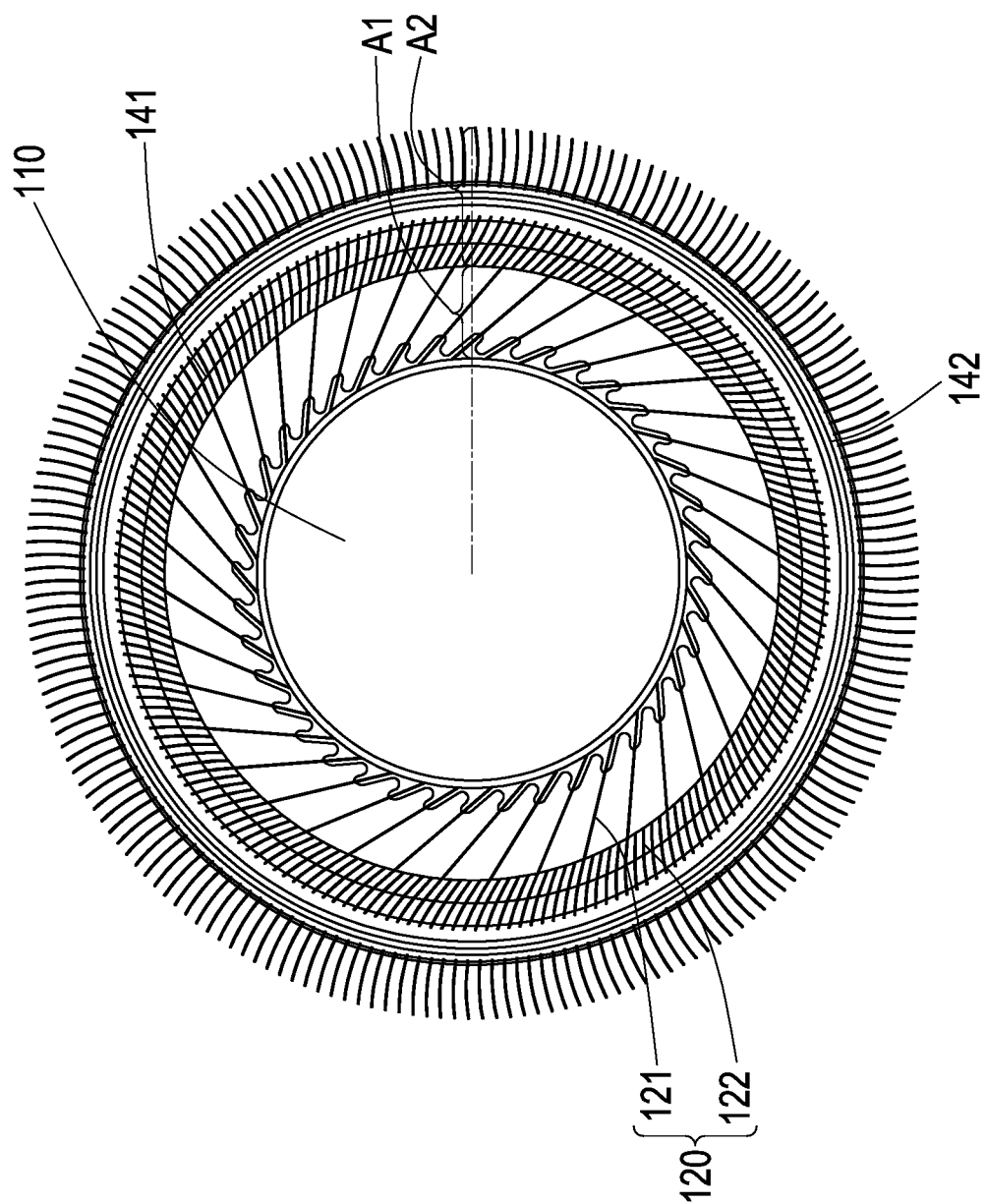
FIG. 2A is a top view of some components of the centrifugal fan of FIG. 1.
Figure 2B:
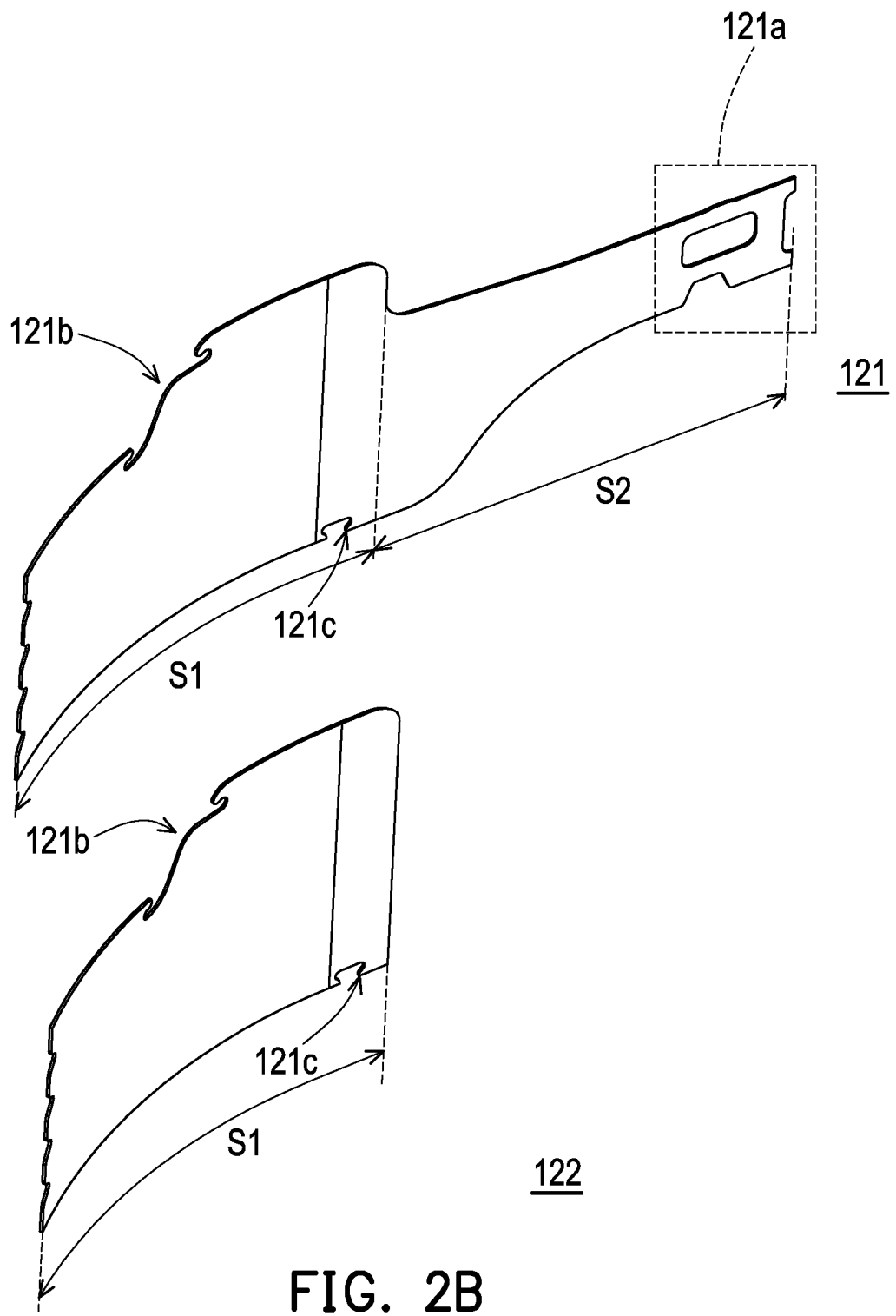
FIG. 2B is a schematic diagram of blades used in the centrifugal fan of FIG. 2A.

FIG. 2A is a top view of some components of the centrifugal fan of FIG. 1. FIG. 2B is a schematic diagram of blades used in the centrifugal fan of FIG. 2A. Please refer to FIGS. 2A and 2B at the same time. In the embodiment, the metal blades 120 are disposed surrounding the hub 110. The metal blades 120 include multiple radial dimensions (equivalent to lengths of the metal blades 120 along radiation directions with a rotation axis of the fan 100 as the center reference), and a structure of the metal blade with a shorter radial dimension is a part of a structure of the metal blade with a longer radial dimension. Here, the metal blade 120 is divided into a first blade 121 and a second blade 122 according to the radial dimensions, and a radial dimension of the first blade 121 is greater than a radial dimension of the second blade 122. The first blade 121 has a joint portion 121a for combining with the hub 110 through an insert molding process, and the joint portion 121a includes a hollow structure and a notch structure, which facilitate the increase in the joint strength of the first blade 121 and the hub 110.

Furthermore, just as the first blade 121 and the second blade 122 with different radial dimensions mentioned above, a structure of the second blade 122 is substantially a part of a structure of the first blade 121. As shown in FIG. 2B, the first blade 121 has different sections S1 and S2, and the second blade 122 is equivalent to the section S1. In other words, the metal blade 120 is formed by the metal blade with the longer radial dimension being stamped with a die, and a part of the metal blade with the longer radial dimension being taken and stamped to form the metal blade with the shorter radial dimension. That is to say, multiple first blades 121 are first produced, and then parts of these first blades 121 are taken to be further stamped so that multiple second blades 122 can be obtained. Such a way means that the stamping die of the metal blade 120 only needs to be designed for the metal blade with the largest dimension, that is, only needs to be designed for the first blade 121, which facilitates simplification of the manufacturing process of the metal blade 120 and thus reduces the manufacturing cost. In addition, since the second blade 122 is substantially formed by taking a partial structure of the first blade 121 adjacent to the end (away from the hub 110), a spacing from the hub 110 exists, and thus the second blade 122 cannot be structurally connected to the hub 110 directly like the first blade 121. Therefore, the fan 100 of the embodiment further includes rings 141 and 142 that surround the hub 110 and connect the metal blades 120.

Figure 2C:
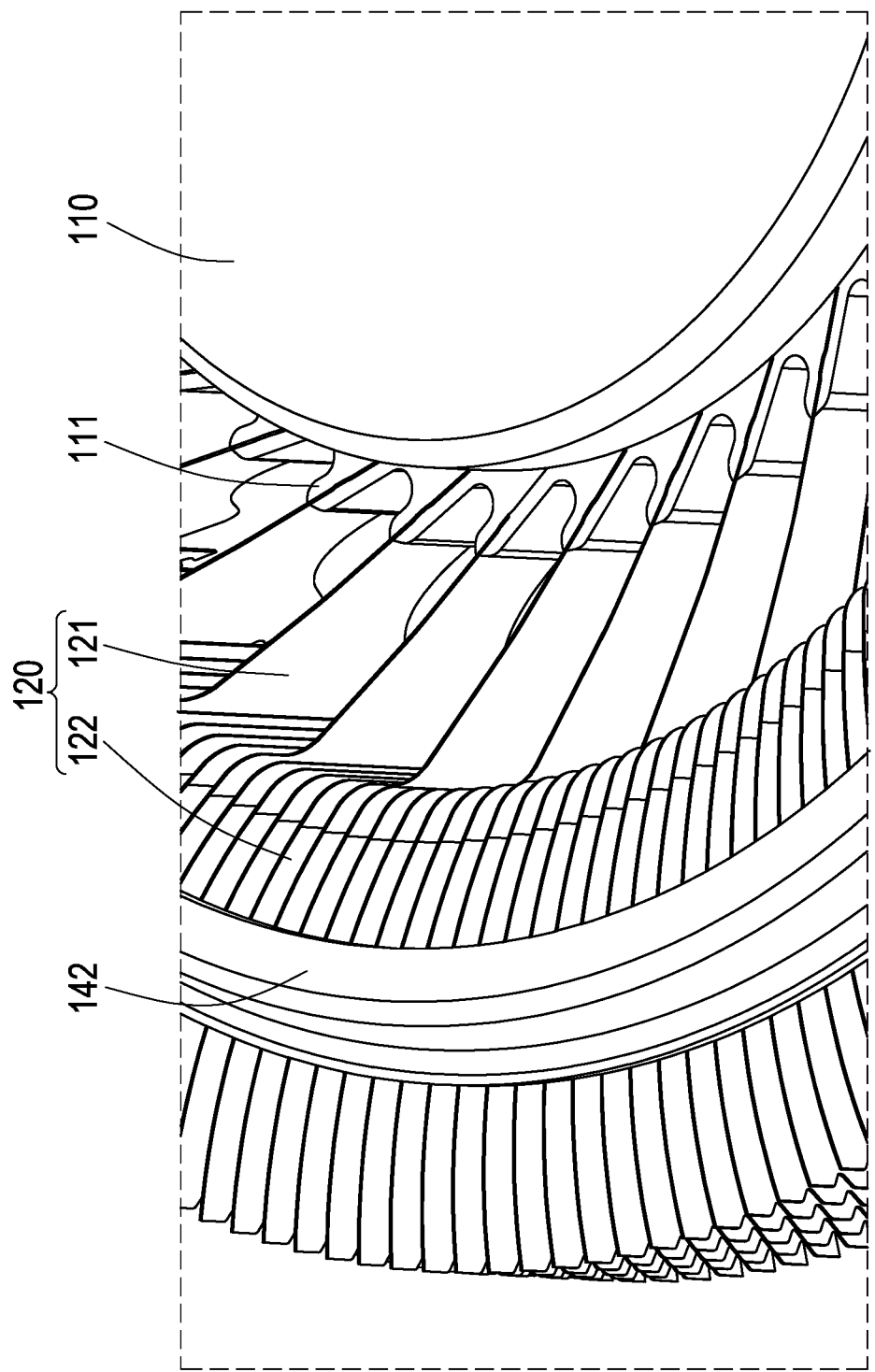
FIGS. 2C and 2D respectively illustrate partial structures of the fan of FIG. 2A from different perspectives.
Figure 2D:
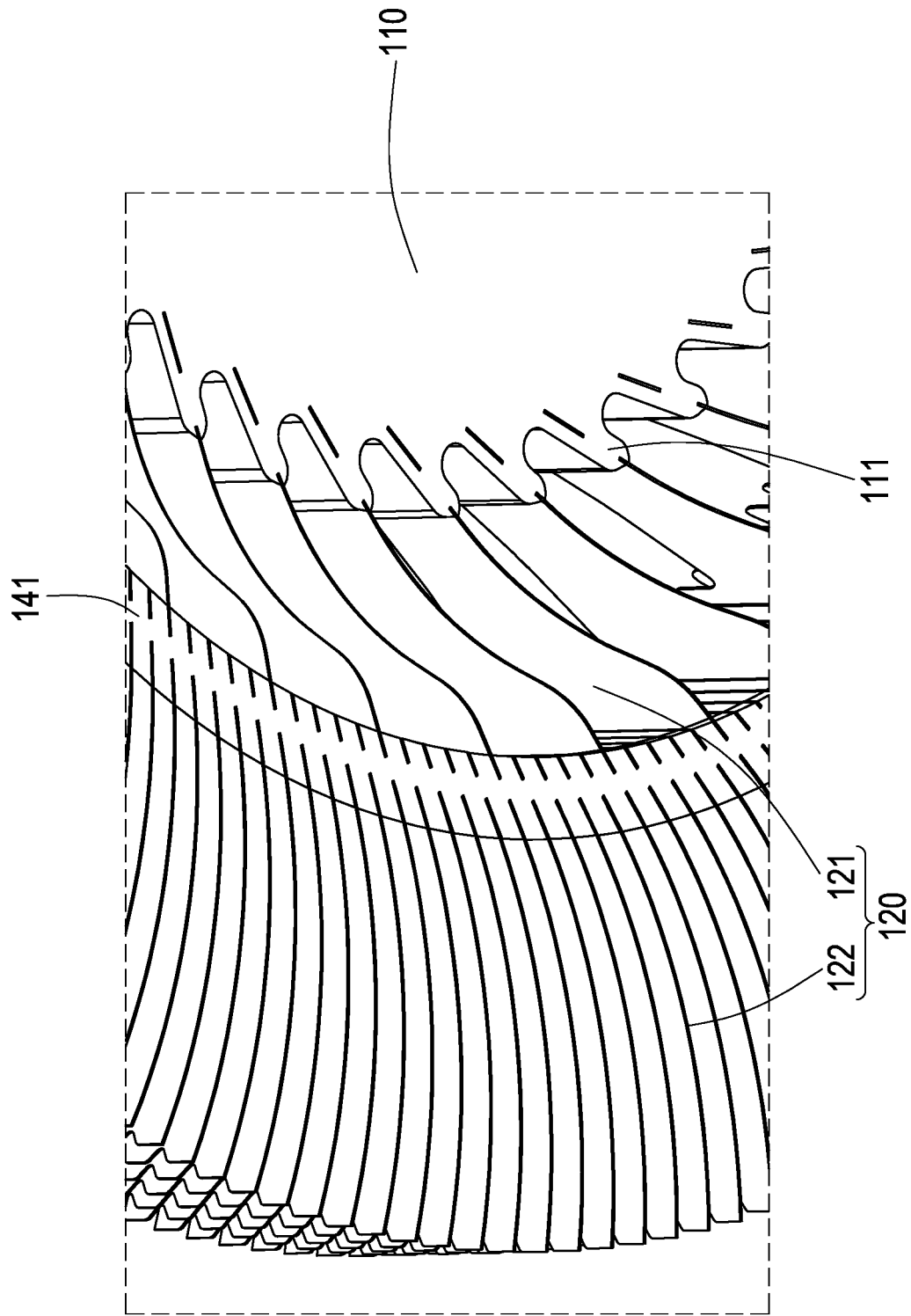

FIGS. 2C and 2D respectively illustrate partial structures of the fan of FIG. 2A from different perspectives. Please refer to FIGS. 2B to 2D at the same time. In the embodiment, the ring 141 and the ring 142 are respectively combined with upper edges and lower edges of the metal blades 120 along a rotation axial direction of the hub 110, and as shown in FIG. 2A, a radial dimension of the ring 141 is smaller than a radial dimension of the ring 142. The same as the above-mentioned combination process of the first blade 121 and the hub 110, in which the joint portion 121a of the first blade 121 is actually covered with a joint portion 111 of the hub 110. The ring 141 and the ring 142 of the embodiment are also combined with the metal blades 120 by insert molding, and the metal blades 120 may be arranged in the die according to FIG. 2A to form the hub 110, the ring 141, and the ring 142 together. As shown in FIG. 2B, the first blade 121 and the second blade 122 individually have joint portions 121b and 121c, such as notch structures, so that the ring 141 and the ring 142 can be filled in the notch structures and further combine two metal blades 120 that are adjacent.

In this way, the metal blades 120 with different radial dimensions, that is, the first blades 121 with the longer radial dimension and the second blades 122 with the shorter radial dimension, form a first ring area A1 and a second ring area A2 with different radial dimensions on a periphery of the hub 110, and distribution numbers of the metal blades 120 in the first ring area A1 and the second ring area A2 are different from each other. Here, the distribution number of the metal blades 120 in the second ring area A2 is greater than the distribution number of the metal blades 120 in the first ring area A1, that is, the distribution number of the metal blades 120 in the second ring area A2 with a longer radial dimension is greater than the distribution number of the metal blades 120 in the first ring area A1 with a shorter radial dimension. As shown in FIG. 2A, the first ring area A1 is adjacent to the hub 110, the second ring area A2 is away from the hub 110, the first blade 121 extends from the hub 110 to the second ring area A2 through the first ring area A1, and the second blade 122 is only located in the second ring area A2, so that the first blade 121 is regarded as a wave blade of the fan 100, and the second blade 122 is regarded as a wheel blade of the fan 100. Moreover, the wave blade is a long blade connected to the hub 110, and the wheel blade is a short blade not connected to the hub 110.

In the embodiment, the metal blades 120 are composed of 40 first blades 121 and 120 second blades 122, and the second blades 122 are substantially away from the hub 110. When the number of metal blades 120 is increased, the situation that the side area of the hub 110 is insufficient for each of the metal blades 120 being firmly combined with the hub 110 can be overcome. That is, in the configuration of the wheel blade and the wave blade, while increasing the number of metal blades 120, the ring 141 and the ring 142 are combined with the metal blades 120 to disperse the stress on the metal blades 120 when the fan 100 is running, so that the structural strength of the metal blades 120 and the hub 110 is not weakened, thereby allowing the thickness target of the metal blade 120 to reach 0.05 mm without breaking.

More importantly, in the embodiment, the first ring area A1 and the second ring area A2 are formed by the metal blades 120 with different radial dimensions, and the distribution numbers of the metal blades 120 in the two ring areas are different from each other, thereby dispersing noise of a fixed frequency when the fan 100 is running. For example, if the rotational speed of the fan 100 is 10 revolutions per second (10 rps), and the metal blades 120 of the embodiment are all of the same radial dimension (radial dimension) as the first blade 121, which is equivalent to 160 first blades 121, the noise generated at the air inlet 131 is concentrated at the frequency of 1600 Hz, that is, the sound pressure level (SPL) measurement at this place sees an obvious peak at the frequency of 1600 Hz, which is equivalent to producing noticeable noise at 1600 Hz. In contrast, in the embodiment, the metal blades 120 with different radial dimensions are equivalent to 40 metal blades 120 distributed in the first ring area A1 and 160 metal blades 120 distributed in the second ring area A2, so peaks are generated at a frequency of 400 Hz and the frequency of 1600 Hz during the SPL measurement. However, compared with the aforementioned peak concentrated at the frequency of 1600 Hz, the embodiment obviously produces an energy dispersion effect, that is, equivalent to the aforementioned peak SPL energy only at the frequency of 1600 Hz being dispersed to peak SPLs at the frequency of 400 Hz and the frequency of 1600 Hz, and the unpleasant sound generated by the fixed frequency is improved through energy dispersion.

On the other hand, a spacing between adjacent blades of the metal blades 120 in the first ring area A1 is different from the spacing between the adjacent blades of the metal blades 120 in the second ring area A2. In fact, as shown in FIG. 2A, the spacing between the adjacent blades of the metal blades 120 in the first ring area A1 is greater than the spacing between the adjacent blades of the metal blades 120 in the second ring area A2, so as to increase the air intake volume at the air inlet 131.

Figure 3:
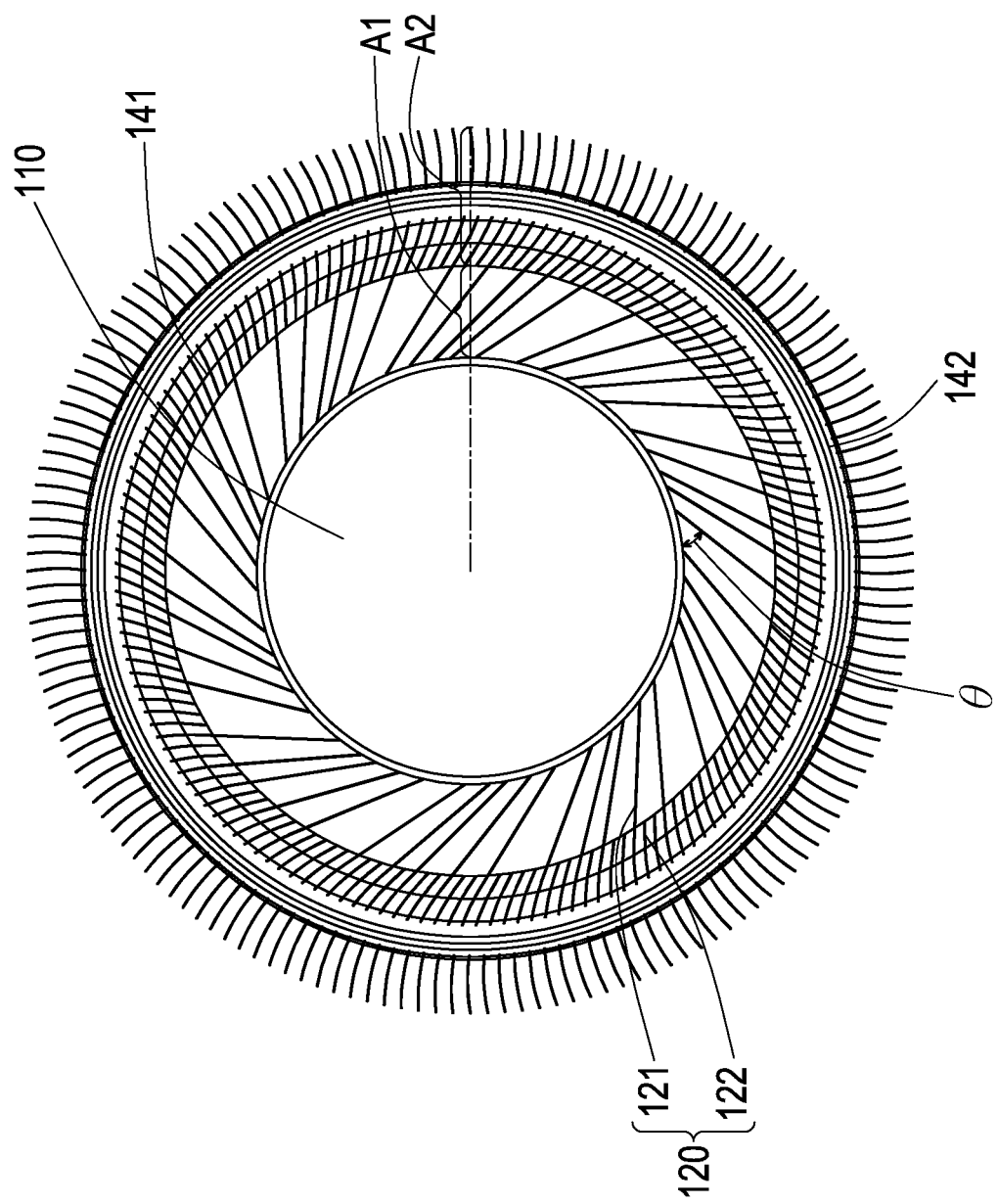
FIG. 3 is a top view of a centrifugal fan according to another embodiment of the disclosure.

FIG. 3 is a top view of a centrifugal fan according to another embodiment of the disclosure. The shell 130 in the previous embodiment is omitted here to facilitate the identification of the distribution of the hub 110 and the metal blades 120. In the aforementioned embodiment, the first blades 121 and the second blades 122 are fixedly matched (one first blade 121 is matched with four second blades 122). The difference between the embodiment and the aforementioned embodiment is that the first blades 121 and the second blades 122 are matched with different periods, and 50 metal blades 120 are distributed in the first ring area A1, and 160 metal blades 120 are distributed in the second ring area A2. At the same time, an included angle θ between the first blade 121 and the hub 110 also changes with the different configurations shown. In other words, what is different from the above-mentioned configuration method of a fixed period change is that the embodiment uses a floating period change to configure the metal blades 120, that is, a designer may change or disrupt the configuration period of the metal blades 120 accordingly, and arrange the metal blades 120 in a random or irregular manner, so as to achieve the aforementioned effect of dispersing the noise peak energy.

Figure 4A:
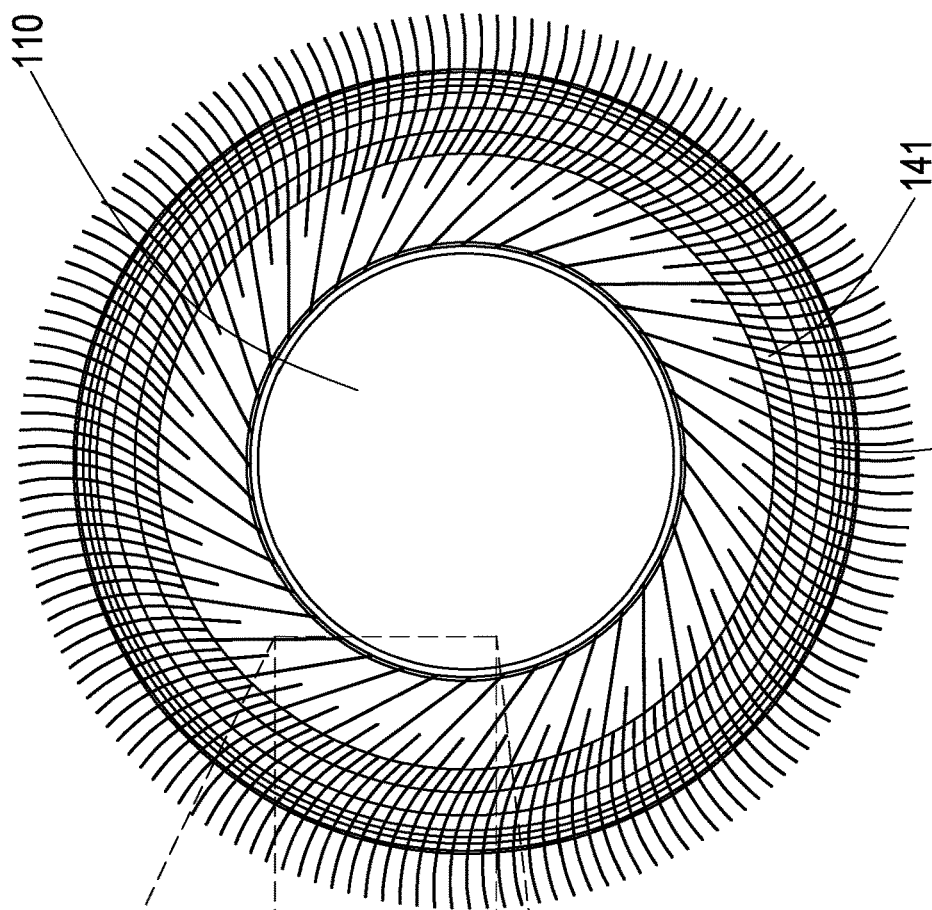
FIG. 4A is a top view of a centrifugal fan according to another embodiment of the disclosure.
Figure 4A:
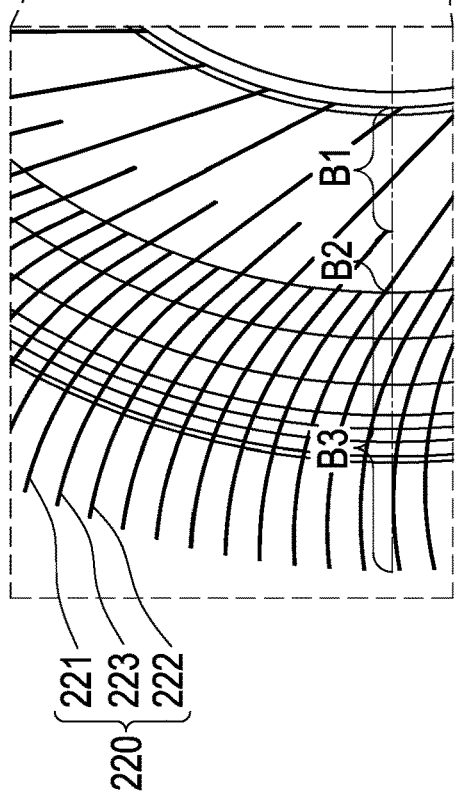
Figure 4B:
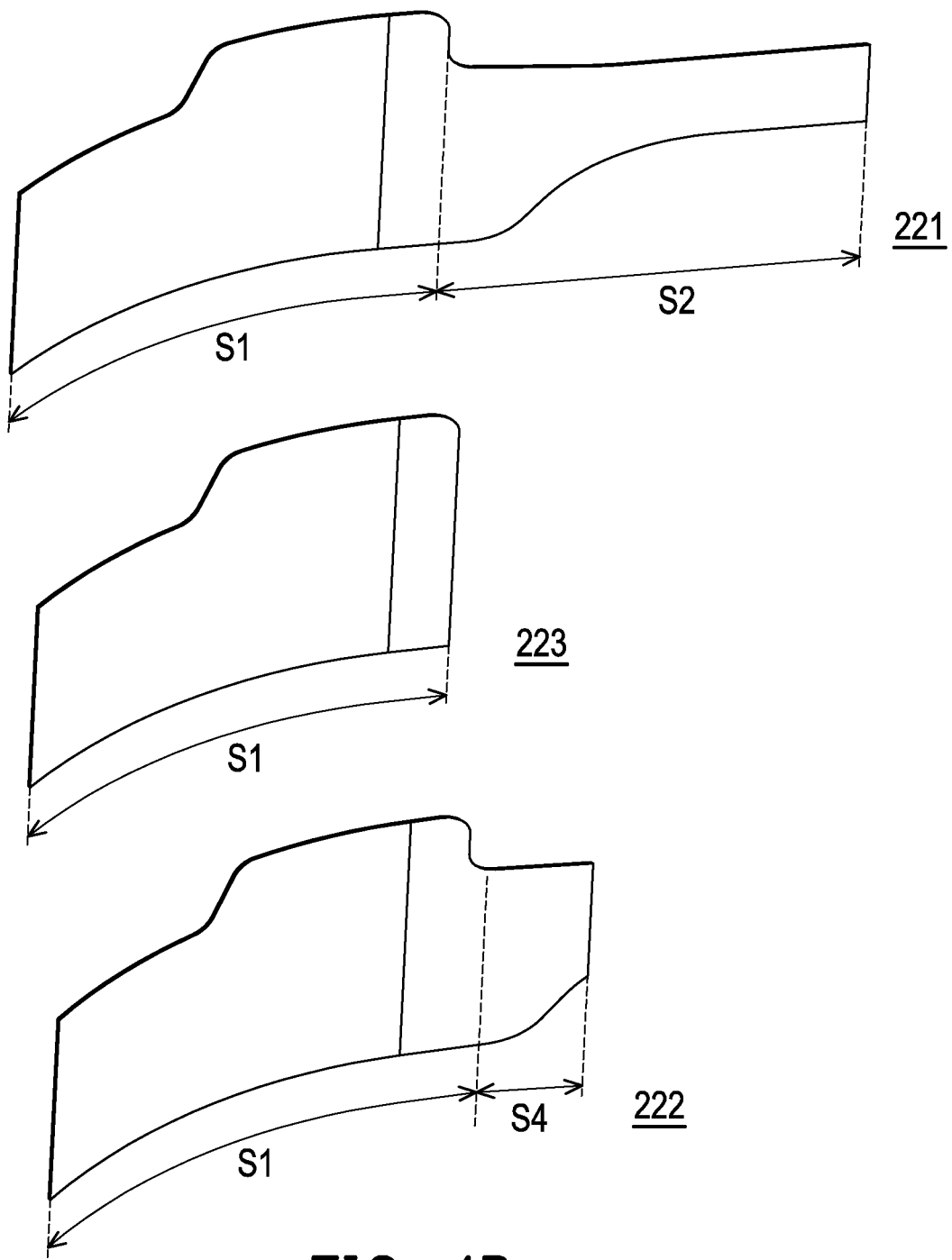
FIG. 4B is a schematic diagram illustrating the composition of the metal blades of FIG. 4A.

FIG. 4A is a top view of a centrifugal fan according to another embodiment of the disclosure. FIG. 4B is a schematic diagram illustrating the composition of the metal blades of FIG. 4A. Please refer to FIGS. 4A and 4B at the same time. Metal blades 220 of the embodiment includes multiple first blades 221, multiple second blades 222, and multiple third blades 223 with three different radial dimensions, a radial dimension of the first blade 221 is greater than a radial dimension of the second blade 222, and the radial dimension of the second blade 222 is greater than a radial dimension of the third blade 223. If the first blade 221 is used as a reference, the third blade 223 of the embodiment is equivalent to a part of a structure of the first blade 221 in the section S1, which is similar to the embodiment shown in FIG. 2B, the second blade 222 is equivalent to adding a section S4 to the part of the structure of the first blade 221 in the section S1, and the section S4 is a part of a structure of the section S2.

Accordingly, the metal blades 220 divide the periphery of the hub 110 into three ring areas with different radial dimensions, which are a first ring area B1, a second ring area B2, and a third ring area B3 in sequence from the hub 110. The first ring area B1 is only distributed with the first blades 221, the second ring area B2 is distributed with the first blades 221 and the second blades 222, and the third ring area B3 is distributed with the first blades 221, the second blades 222, and the third blades 223, so that a distribution number of the metal blades 220 in the first ring area B1 is smaller than the distribution number of the metal blades 220 in the second ring area B2, and the distribution number of the metal blades 220 in the second ring area B2 is smaller than the distribution number of the metal blades 220 in the third ring area B3. Moreover, 40 metal blades 220 are distributed in the first ring area B1, 80 metal blades 220 are distributed in the second ring area B2, and 160 metal blades 220 distributed in the third ring area B3. Accordingly, the distribution numbers of the metal blades 220 are different from each other in these ring areas, and the noise peak energy can be effectively dispersed.

Figure 5A:
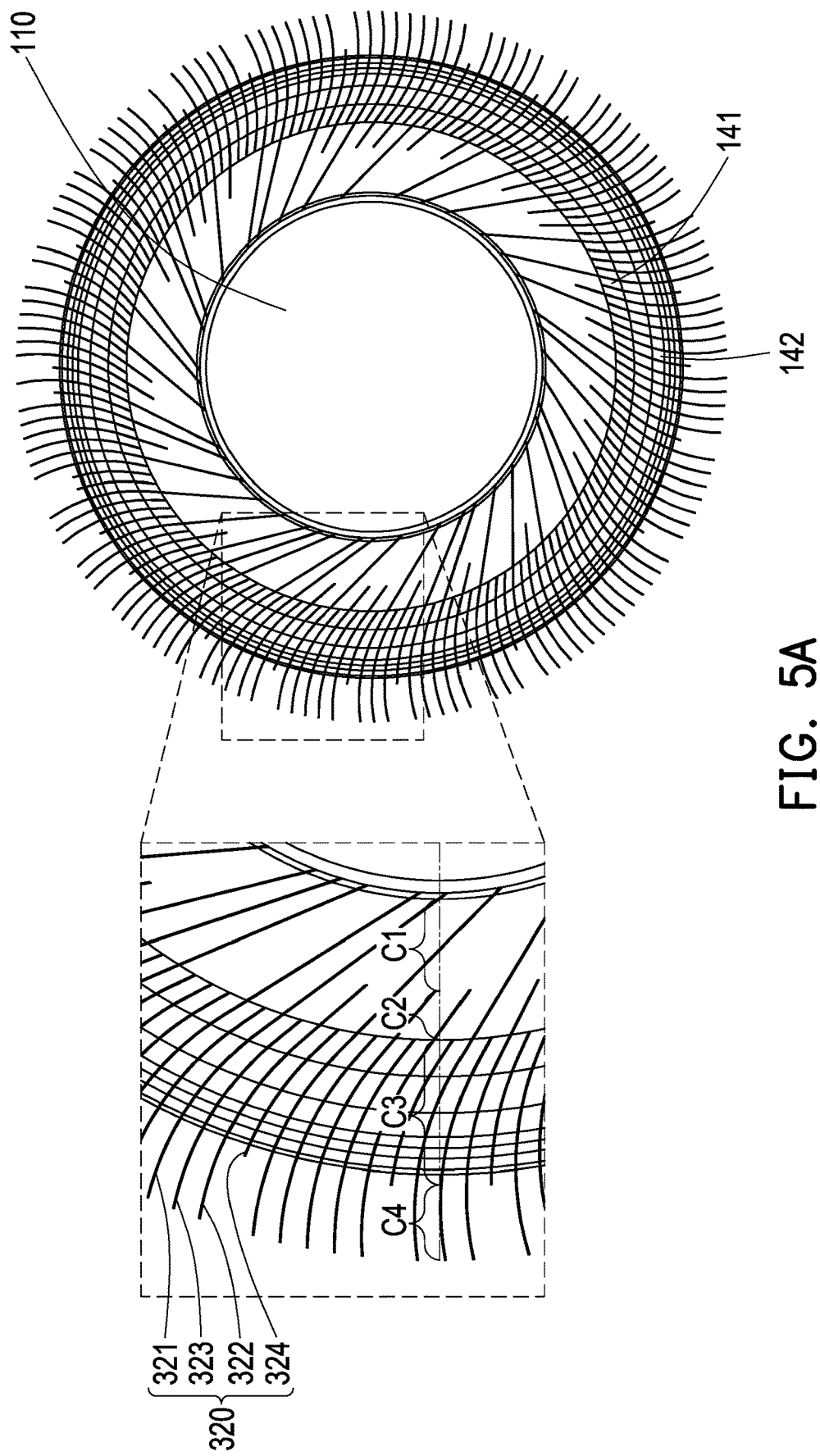
FIG. 5A is a top view of a centrifugal fan according to another embodiment of the disclosure.
Figure 5B:
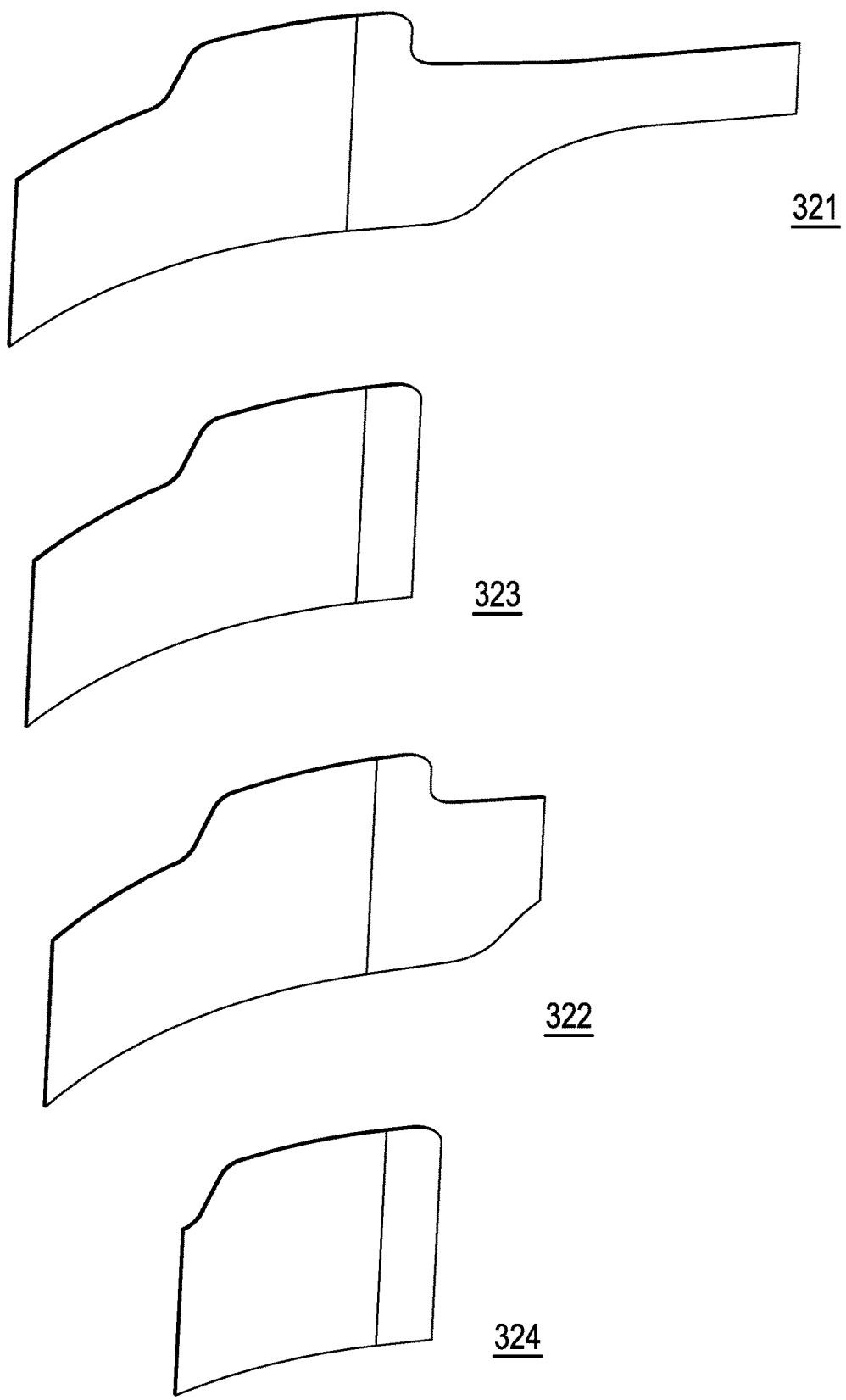
FIG. 5B is a schematic diagram illustrating the composition of the metal blades of FIG. 5A.

FIG. 5A is a top view of a centrifugal fan according to another embodiment of the disclosure. FIG. 5B is a schematic diagram illustrating the composition of the metal blades of FIG. 5A. Please refer to FIGS. 5A and 5B at the same time. Metal blades 320 of the embodiment include multiple first blades 321, multiple second blades 322, multiple third blades 323, and multiple fourth blades 324 with four different radial dimensions. A radial dimension of the first blade 321 is greater than a radial dimension of the second blade 322, the radial dimension of the second blade 322 is greater than a radial dimension of the third blade 323, and the radial dimension of the third blade 323 is greater than a radial dimension of the fourth blade 324. If the first blade 321 is used as a reference, the second blade 322, the third blade 323, and the fourth blade 324 in the embodiment may be regarded as parts of a structure of the first blade 321, respectively, similar to the above-mentioned embodiments.

Accordingly, the metal blades 320 divide the periphery of the hub 110 into four ring areas with different radial dimensions, which are a first ring area C1, a second ring area C2, a third ring area C3, and a fourth ring area C4 in sequence from the hub 110. The first ring area C1 is only distributed with the first blades 321, the second ring area C2 is distributed with the first blades 321 and the second blades 322, and the third ring area C3 is distributed with the first blades 321, the second blades 322, the third blades 323, and the fourth blades 324, and the fourth ring area C4 is distributed with the first blades 321, the second blades 322, and the third blades 323. Such a way is equivalent to 40 metal blades 320 being distributed in the first ring area C1, 68 metal blades 320 being distributed in the second ring area C2, 160 metal blades 320 being distributed in the third ring area C3, and 133 metal blades 320 being distributed in the fourth ring area C4, and the distribution of the metal blades 320 in each of the ring areas adopts an irregular (aperiodic) distribution, so that the distribution numbers of the metal blades 320 in these ring areas are different from each other, which can effectively disperses the noise peak energy.

It should also be mentioned that, in the above embodiments, the overall center of gravity of the fan 100 needs to be adjusted according to the distribution of the metal blades (120, 220, or 320). For example, after completing the arrangement of the metal blades (120, 220, or 320), whether the overall center of gravity of the fan 100 falls on the rotation axis of the hub 110 is simulated, if not, the configuration volume and weight of the hub 110 or the ring (141 or 142) may be further adjusted, so that the fan 100 can maintain a fixed center of gravity and dynamic balance during operation.

To sum up, in the above-mentioned embodiments of the disclosure, the centrifugal heat dissipation fan of the portable electronic device forms ring areas of different radial dimensions by arranging and configuring metal blades of multiple radial dimensions around the hub, and the distribution numbers of metal blades in these ring areas are different from each other. In this way, the metal blade forms a state in which the wheel blades and the wave blades are matched with each other, that is, the ring is served as the combination structure of the metal blades, so as to solve the situation that the number of metal blades increases and cannot be combined with the hub, thereby providing increased fan performance (air volume) and the structural strength of load operation. Furthermore, the metal blades have different distribution numbers along the radial areas, which may further disperse the situation of noise concentration caused by a single frequency. More importantly, since the structure of the metal blade with a shorter radial length is substantially a part of the structure of the metal blade with a longer radial length, the manufacturing process of the metal blade can be further saved. Only a single stamping die is used to first obtain the metal blades with the longer radial dimension, and then the metal blades with the shorter radial dimension can be formed by further stamping from these metal blades with the longer radial dimension, thereby effectively reducing the manufacturing cost of the fan.

What is claimed is:

1. A centrifugal heat dissipation fan of a portable electronic device, and the centrifugal heat dissipation fan comprising:
   a hub;
   a plurality of metal blades, disposed surrounding the hub, the metal blades comprising a plurality of radial dimensions, and structures of the metal blades with a shorter radial dimension are parts of structures of the metal blades with a longer radial dimension, wherein the metal blades having different radial dimensions form at least two ring areas, and distribution numbers of the metal blades in the at least two ring areas are different from each other; and
   at least one ring, surrounding the hub and connecting the metal blades, wherein the metal blades having different radial dimensions divide a periphery of the hub into a first ring area, a second ring area, a third ring area, and a fourth ring area, in which a radial dimension of the first ring area is smaller than a radial dimension of the second ring area, the radial dimension of the second ring area is smaller than a radial dimension of the third ring area, and the radial dimension of the third ring area is smaller than a radial dimension of the fourth ring area, and the metal blades comprise a plurality of first blades, a plurality of second blades, a plurality of third blades, and a plurality of fourth blades, the first blade extends from the hub to the fourth ring area through the first ring area, the second ring area, and the third ring area, the second blade extends from the second ring area to the fourth ring area through the third ring area, the third blade extends from the third ring area to the fourth ring area, and the fourth blade is located in the third ring area,
   wherein a distribution of the metal blades in each of the first ring area, the second ring area, the third ring area, and the fourth ring area adopts an aperiodic distribution to disperse a noise peak energy generated by the centrifugal heat dissipation fan.

2. The centrifugal heat dissipation fan according to claim 1, wherein the metal blades are formed by the metal blades with the longer radial dimension being stamped with a die, and parts of the metal blades with the longer radial dimension being taken and stamped to form the metal blades with the shorter radial dimension.

3. The centrifugal heat dissipation fan according to claim 1, wherein the distribution number of the metal blades in the ring area with a longer radial dimension is greater than the distribution number of the metal blades in the ring area with a shorter radial dimension.

4. The centrifugal heat dissipation fan according to claim 1, wherein the metal blades comprise a plurality of first blades and a plurality of second blades, a radial dimension of the first blade is greater than a radial dimension of the second blade, and the at least two ring areas comprise a first ring area adjacent to the hub and a second ring area away from the hub, the first blade extends from the hub to the second ring area through the first ring area, and the second blades are located in the second ring area.

5. The centrifugal heat dissipation fan according to claim 4, wherein the first blades are combined with the hub, and included angles between the first blades and the hub vary with positions.

6. The centrifugal heat dissipation fan according to claim 1, wherein the at least one ring comprises two rings, which are respectively combined with upper edges and lower edges of the metal blades along a rotation axial direction of the hub.

7. The centrifugal heat dissipation fan according to claim 6, wherein the two rings have different radial dimensions.

8. The centrifugal heat dissipation fan according to claim 1, wherein the metal blades having different radial dimensions divide a periphery of the hub into a first ring area, a second ring area, and a third ring area, in which a radial dimension of the first ring area is smaller than a radial dimension of the second ring area, and the radial dimension of the second ring area is smaller than a radial dimension of the third ring area, and the metal blades comprise a plurality of first blades, a plurality of second blades, and a plurality of third blades, the first blade extends from the hub to the third ring area through the first ring area and the second ring area, the second blade extends from the second ring area to the third ring area, and the third blade is located in the third ring area.

9. The centrifugal heat dissipation fan according to claim 8, wherein the distribution number of the metal blades in the second ring area is greater than the distribution number of the metal blades in the first ring area, and the distribution number of the metal blades in the third ring area is greater than the distribution number of the metal blades in the second ring area.

10. The centrifugal heat dissipation fan according to claim 1, wherein the distribution number of the metal blades in the second ring area is greater than the distribution number of the metal blades in the first ring area, the distribution number of the metal blades in the fourth ring area is greater than the distribution number of the metal blades in the second ring area, and the distribution number of the metal blades in the third ring area is greater than the distribution number of the metal blades in the fourth ring area.

11. The centrifugal heat dissipation fan according to claim 1, wherein parts of the metal blades are combined with the hub and the ring by insert molding.

12. The centrifugal heat dissipation fan according to claim 1, wherein the distribution number of the metal blades adjacent to the hub in the at least two ring areas is smaller than the distribution number of the metal blades away from the hub in the at least two ring areas.

13. The centrifugal heat dissipation fan according to claim 1, wherein a spacing between adjacent blades of the metal blades adjacent to the hub in the at least two ring areas is greater than the spacing between the metal blades away from the hub in the at least two ring areas.

14. The centrifugal heat dissipation fan according to claim 1, wherein spacings of adjacent blades of the metal blades in the at least two ring areas are different from each other.

* * * * *